United States Patent [19]
Arita et al.

[11] Patent Number: 5,292,373
[45] Date of Patent: Mar. 8, 1994

[54] APPARATUS AND PROCESS FOR WASHING WAFERS

[75] Inventors: Naomi Arita; Yoshitaka Dansui, both of Osaka, Japan

[73] Assignee: Matsushita Electric Industrial Co., Ltd., Osaka, Japan

[21] Appl. No.: 910,920

[22] Filed: Jul. 9, 1992

[30] Foreign Application Priority Data

Jul. 10, 1991 [JP] Japan .................. 3-169936

[51] Int. Cl.⁵ .............. H01L 21/306; B08B 3/08
[52] U.S. Cl. ...................... 134/2; 134/25.4; 437/946
[58] Field of Search .......... 134/2, 3, 25.4, 902, 134/111, 133, 184; 437/946

[56] References Cited

U.S. PATENT DOCUMENTS

| | | | |
|---|---|---|---|
| 4,816,081 | 3/1989 | Mehta et al. | 134/30 |
| 4,869,278 | 9/1989 | Bran | 134/184 |
| 4,984,597 | 1/1991 | McConnell et al. | 134/902 |
| 5,014,727 | 5/1991 | Aigo | 134/902 |
| 5,071,776 | 12/1991 | Matsushita et al. | 134/2 |

FOREIGN PATENT DOCUMENTS

| | | | |
|---|---|---|---|
| 61-42917 | 3/1986 | Japan | 134/902 |
| 2-132828 | 5/1990 | Japan . | |

Primary Examiner—Olik Chaudhuri
Assistant Examiner—Ourmazd S. Ojan
Attorney, Agent, or Firm—Lowe, Price, LeBlanc & Becker

[57] ABSTRACT

An apparatus for washing a wafer, having a wafer-washing tank holding a washing liquid and receiving a wafer, a washing-liquid inlet provided in a first part of the sidewall of the tank, a washing-liquid outlet provided in a second part of the sidewall of the tank opposite to the first part of the sidewall, and a device holding the wafer in the tank so that the wafer is parallel to the level of the washing liquid when the wafer is immersed into or positioned in the washing liquid in the tank, and a device producing an essentially horizontal flow of the washing liquid in the tank. A process for washing a wafer, having the steps of producing a horizontal flow of the washing liquid in the tank, immersing a wafer cassette holding the wafer into the washing liquid in the tank so that the wafer is parallel to the level of the washing liquid in the tank, and subsequently positioning the cassette in the washing liquid in the tank so that the wafer is parallel to the level of the washing liquid in the tank. No free particulates which have detached from the back surface of either of adjacent wafers pollute the other wafer.

1 Claim, 3 Drawing Sheets

APPARATUS AND PROCESS FOR WASHING WAFERS

BACKGROUND OF THE INVENTION

1. Field of Invention Application

The present invention relates to an apparatus and a process for washing wafers and more particularly to an apparatus and a process for washing semiconductor wafers.

2. Description of the Related Art

Recently, a production of electronic devices on a semiconductor wafer has required for removing finer particulates as sizes of the semiconductor devices have been reduced. In general, the back surface of a semiconductor wafer has a great number of particulates stuck thereto during transport, hold or processing of the semiconductor wafer by a semiconductor producing apparatus. It is said that the number of these particulates are a few ten times to a few thousand times greater than the number of particulates sticking on the front surface of the semiconductor wafer. The particulates sticking to the back surface of the semiconductor wafer pass along an interface of a washing liquid and the semiconductor wafer and pollute the front surface of a preceding adjacent semiconductor wafer which has been immersed in the washing liquid when the next semiconductor wafer the back surface of which has the great number of particulates is immersed in the washing liquid during a wet process such as washing. Thus there is a problem that the particulates on the back surface of the semiconductor wafer reduce the yield of electronic devices formed on the front surface of the semiconductor wafer.

An example of a prior-art apparatus for washing a semiconductor wafer will be described with reference to FIG. 4, hereinafter. FIG. 4 illustrates the prior-art apparatus for washing a semiconductor wafer in which a wafer cassette holding semiconductor wafers is placed.

The apparatus comprises an internal wafer-washing tank 101, a washing-liquid filter 104, a circulating pump 105 and an external tank 111. The wafer-washing tank 101 receives a wafer cassette 107 holding semiconductor wafers 106. The external tank 111 surrounds the wafer-washing tank 101. The bottom of the external tank 111 has a washing-liquid outlet 110 communicating with the inlet of the circulating pump 105 through a pipe 103. The outlet of the circulating pump 105 communicates with the washing-liquid filter 104 which is connected to a washing-liquid inlet 109 which is provided in the bottom of the wafer-washing tank 101.

In operation, the circulating pump 105 delivers a washing liquid into the wafer-washing tank 101 through the washing-liquid inlet 109. The external tank 111 receives an overflow of the washing-liquid from the wafer-washing tank 101. The circulating pump 105 circulates the washing liquid from the washing-liquid outlet 110 to the washing-liquid inlet 109 through the washing-liquid filter 104. The washing-liquid filter 104 filters particulates 108 out of the washing-liquid from the washing-liquid outlet 110. Then, the circulating pump 105 delivers the purified or particulate-free washing-liquid from the washing-liquid filter 104 to the wafer-washing tank 101 through the washing-liquid inlet 109. Thus, the washing liquid passes upwardly through the interior of the wafer-washing tank 101. The wafer cassette 107 is immersed into or positioned in the washing liquid in the wafer-washing tank 101 so that the planes of the semiconductor wafers 106 held in the wafer cassette 107 are essentially perpendicular to the level of the washing liquid in the wafer-washing tank 101. Thus, there is a problem in that particulates 108 sticking to the back surfaces of the semiconductor wafers 106 may stick to the front surfaces of adjacent semiconductor wafers 106 in interfaces of the washing liquid and the semiconductor wafers 106 placed in the wafer-washing tank 101. There is also a problem in that free particulates 108 tend to stay on the surface of the washing liquid in the wafer-washing tank 101 since the washing liquid passes upwardly through the interior of the wafer-washing tank 101.

Japanese unexamined patent application publication HEI.2-132828 discloses a wafer-washing tank. This wafer-washing tank comprises a first vertical flow-straightening plate having a plurality of washing-liquid inlets, a second vertical flow-straightening plate having a plurality of washing-liquid outlets, the first and second vertical flow-straightening plates being arranged opposite each other through a spacing in which a wafer is placed, a washing-liquid horizontally flowing from the washing-liquid inlets to the washing-liquid outlets along the planes of the wafer. The wafer-washing tank lacks a means for horizontally holding the wafer in the washing-liquid in the wafer-washing tank in a case where the sidewall of the wafer-washing tank has a washing-liquid inlet. On the other hand, the sidewall of the wafer-washing tank lacks a washing-liquid inlet and a washing-liquid outlet but rather the bottom of the wafer-washing tank has the washing-liquid inlet in a case where the wafer-washing tank includes the means for horizontally holding the wafer in the washing-liquid in the wafer-washing tank. The publication HEI.2-132828 discloses no case where the sidewall of the wafer-washing tank has the washing-liquid outlet.

SUMMARY OF THE INVENTION

Therefore, an object of the present invention is to provide an apparatus and a process for washing wafers preventing particulates sticking to the back surface of a wafer from sticking to the front surface of an adjacent wafer, or quickly removing the particulates from the front surface of the adjacent wafer even if they will stick to the front surface of the adjacent wafer.

An apparatus for washing a wafer of the present invention comprises a wafer-washing tank holding a washing liquid and receiving a wafer, a washing-liquid inlet provided in a first part of the sidewall of the tank, a washing-liquid outlet provided in a second part of the sidewall of the tank opposite to the first part of the sidewall, and means for holding the wafer in the tank so that the wafer is parallel to the level of the washing liquid when the wafer is immersed into or positioned in the washing liquid in the tank, and means for producing an essentially horizontal flow of the washing liquid in the tank.

A process for washing a wafer of the present invention comprises the steps of producing a horizontal flow of the washing liquid in the tank, immersing means for holding the wafer into the washing liquid in the tank so that the wafer is parallel to the level of the washing liquid in the tank, and subsequently positioning the holding means in the washing liquid in the tank so that the wafer is parallel to the level of the washing liquid in the tank.

In the present invention, since wafers are immersed into the washing liquid in the wafer-washing tank in horizontal positions, possible free particulates which have detached from the back surfaces of the wafers immediately go to the washing-liquid outlet. Thus, no free particulates which have detached from the back surface of either of adjacent wafers pollute the other wafer.

DESCRIPTION OF THE PREFERRED EMBODIMENT

An apparatus for washing semiconductor wafers according to a preferred embodiment of the present invention will be described with reference to the drawings.

Figure 1:
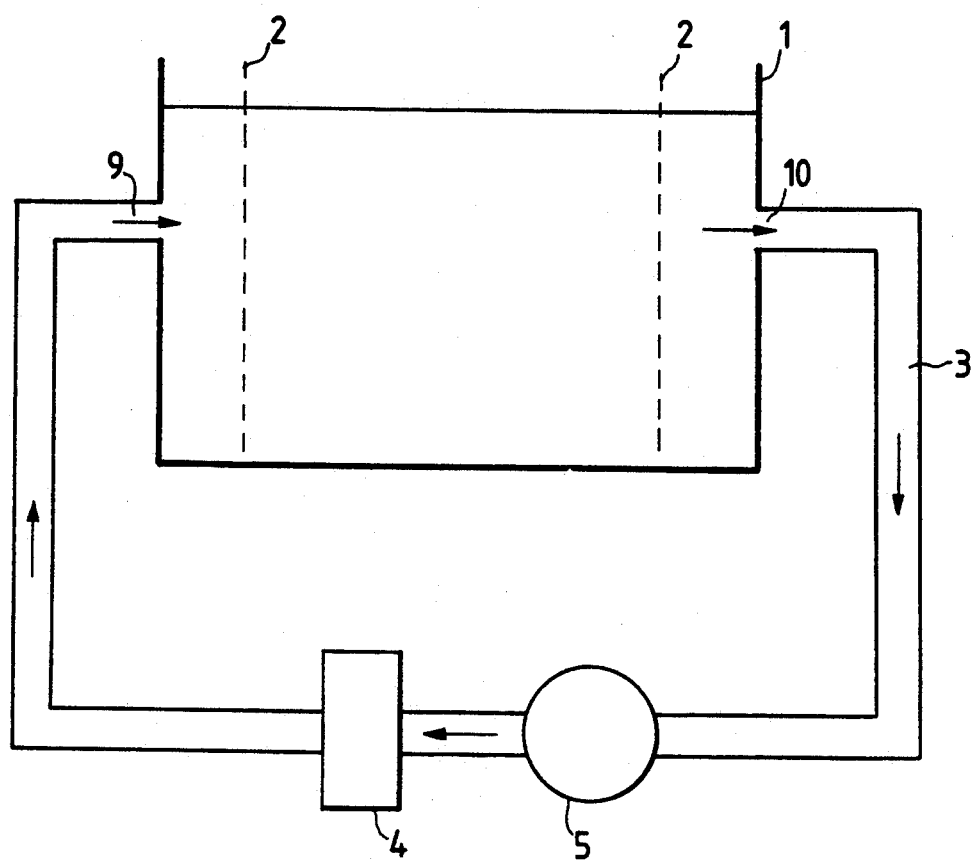
FIG. 1 is a schematic diagram of an apparatus for washing semiconductor wafers according to an embodiment of the present invention.

FIG. 1 is a schematic diagram of the apparatus for washing semiconductor wafers according to the embodiment of the present invention. The apparatus comprises a wafer-washing tank 1, two opposite slit partitions 2 placed in the wafer-washing tank 1, a piping 3 laterally extending outwardly from the sidewall of the wafer-washing tank 1, a washing-liquid filter 4 provided intermediate the piping 3, and a circulating pump 5 provided intermediate the piping 3. The piping 3 communicates with the wafer-washing tank 1 through a washing-liquid inlet 9 and a washing-liquid outlet 10. The respective washing-liquid inlet 9 and washing-liquid outlet 10 are provided in first and second parts of the sidewall of the wafer-washing tank 1 so that the internal open edge of the washing-liquid inlet 9 is opposite the internal open edge of the washing-liquid outlet 10. A first slit partition 2 is opposite the internal open edge of the washing-liquid inlet 9 and a second slit partition 2 is opposite the internal opening of the liquid-chemical outlet 10.

Figure 2:
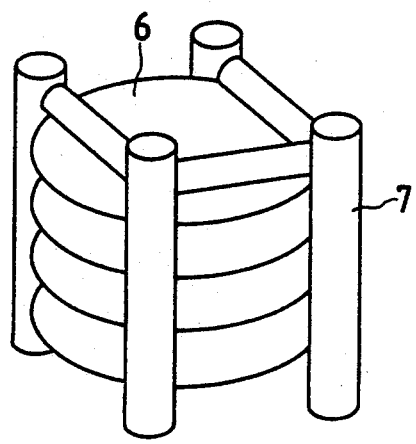
FIG. 2 is a perspective view of a semiconductor wafer cassette used with the apparatus for washing semiconductor wafers of FIG. 1.

FIG. 2 illustrates a state that a wafer cassette 7 holds a plurality of semiconductor wafers 6 in horizontal positions.

Figure 3:
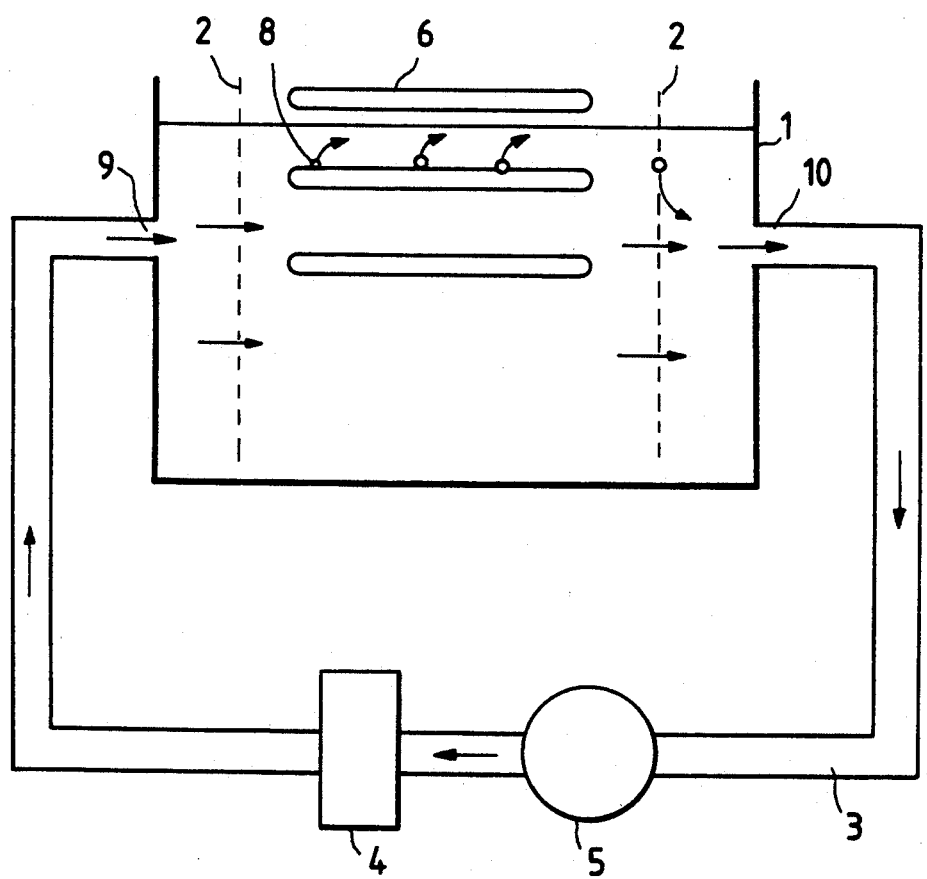
FIG. 3 is a schematic diagram of a state that semiconductor wafers are positioned in a wafer-washing tank of the apparatus for washing semiconductor wafers of FIG. 1.
Figure 4:
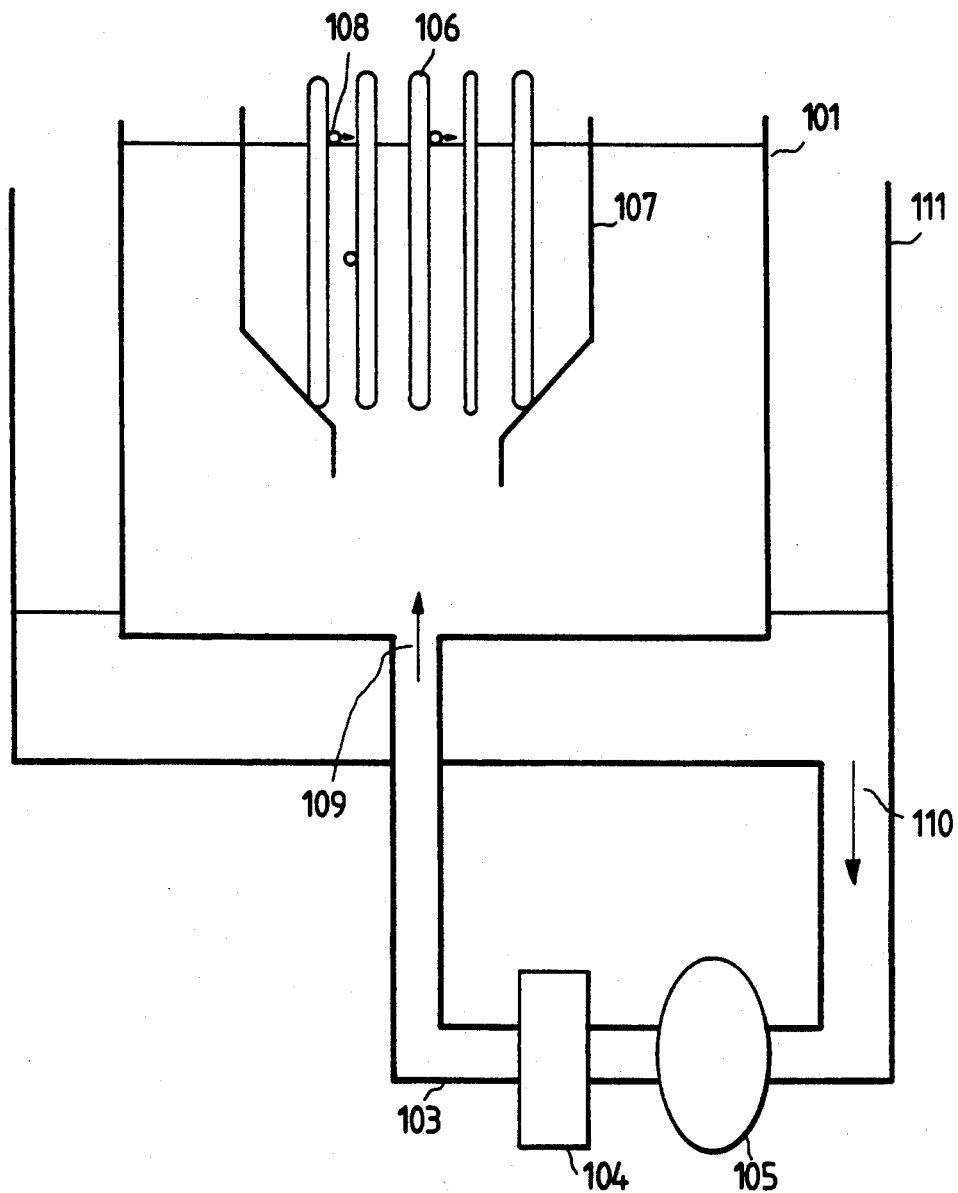
FIG. 4 is a schematic diagram of a prior-art apparatus for washing semiconductor wafers.

The operation of the apparatus for washing semiconductor wafers will be described with reference to FIGS. 1-3, hereinafter. FIG. 3 illustrates a state that the semiconductor wafers 6 are being immersed into the wafer-washing tank 1 between the slit partitions 2. In general, the back surface of each of the unwashed semiconductor wafers 6 has a great number of particulates 8 stuck thereto during a processing of a semiconductor producing apparatus. The semiconductor wafers 6 are positioned horizontally or in parallel to the level of the washing-liquid in the wafer-washing tank 1.

The circulating pump 5 draws the washing liquid to the internal open edge of the washing-liquid outlet 10 through the second slit partition 2 and then delivers the washing liquid to the washing-liquid inlet 9 through the washing-liquid filter 4. The washing liquid which has passed through the washing-liquid inlet 9 is supplied to the central zone in the wafer-washing tank 1 through the first slit partition 2. Thus, the apparatus for washing semiconductor wafers continuously maintains the washing liquid clean and in a state of a parallel horizontal flow. As shown in FIG. 2, the wafer cassette 7 holds the semiconductor wafers 6 parallel to one another so that all of the semiconductor wafers 6 lie or are parallel to the level of the washing liquid when the wafer cassette 7 is immersed into or positioned in the washing liquid in the central zone in the wafer-washing tank 1. When the wafer cassette 7 is immersed into the washing liquid in the wafer-washing tank 1, the back surface of each of the semiconductor wafers 6 is upper, and the front surface of that semiconductor wafer 6 on which electronic devices are to be formed is lower and a semiconductor wafer 6 is held above the level of the washing liquid in the wafer-washing tank 1 until possible particulates 8 sticking to the back surface of a preceding semiconductor wafer 6 has gone out of the washing liquid in a region right below the next semiconductor wafer 6 held above the level of the washing liquid. Therefore, even if the back surface of the preceding semiconductor wafer 6 which has been immersed into the washing liquid in the wafer-washing tank 1 has particulates 8 sticking thereto and then the particulates 8 detach from the back surface of the preceding semiconductor wafer 6, the particulates 8 have detached and passed to the washing-liquid outlet 10 because of the flow of the washing liquid until the front surface of the immediately following semiconductor wafer 6 is immersed into the washing liquid in the wafer-washing tank 1. Thus, the surface of the washing liquid in the wafer-washing tank 1 continues clean or particulate-free. In addition, even when all of the semiconductor wafers 6 held in the wafer cassette 7 are immersed into the washing liquid in the wafer-washing tank 1, the flow of the washing liquid between adjacent semiconductor wafers 6 continues clean or particulate-free, i.e., no particulates stay in zones between adjacent semiconductor wafers 6 positioned in the washing liquid in the wafer-washing tank 1.

In the embodiment of the present invention, the back surfaces of the semiconductor wafers 6 are upper when the wafer cassette 7 is immersed into or positioned in the washing liquid in the wafer-washing tank 1. However, the front surfaces of the semiconductor wafers 6 may alternatively be upper.

FIG. 2 shows the wafer cassette 7 according to the embodiment of the present invention. The wafer cassette 7 may have various structures if it can hold the semiconductor wafers 6 in horizontal positions in the wafer-washing tank 1.

In the embodiment of the present invention, the apparatus for washing semiconductor wafers employs the slit partitions 2 placed in the wafer-washing tank 1. However, the apparatus may alternatively employ partitions having any forms if they can produce a flow of the washing liquid parallel to the planes of the semiconductor wafers immersed into or positioned in the washing liquid in the wafer-washing tank 1.

The present invention is not rigidly restricted to the embodiments described above. It is to be understood that a person skilled in the art can easily change and modify the present invention without departing from the spirit of the invention defined in the appended claims.

What is claimed is:

1. A process for washing semiconductor wafers comprising the steps of:

holding a plurality of semiconductor wafers parallel to each other in a holding means;

producing an essentially horizontal flow of a washing liquid in a wafer-washing tank; and immersing said holding means into the washing liquid in the wafer-washing tank so that the front and back surfaces of the semiconductor wafers are parallel to the level of the washing liquid in the wafer-washing tank and the back surface of each of the semiconductor wafers is upper and the front surface of that semiconductor wafer is lower, said immersing step including a step of holding at least one of the semiconductor wafers above the level of the washing liquid in the wafer-washing tank until a possible particulate sticking to the back surface of a preceding semiconductor wafer which has been immersed in the washing liquid in the wafer-washing tank has gone out of the washing liquid in a region right below the one semiconductor wafer.

* * * * *